United States Patent
Liscinsky et al.

(10) Patent No.: US 12,387,872 B2
(45) Date of Patent: Aug. 12, 2025

(54) VOLTAGE BOOSTER ISOLATION TRANSFORMER SYSTEM AND METHOD OF OPERATING THE SAME

(71) Applicant: Hubbell Incorporated, Shelton, CT (US)

(72) Inventors: Steve Liscinsky, Stratford, CT (US); Jean-Yves Schneider, Fox Point, WI (US); Joseph DiMaria, Waterbury, CT (US); Jack Brunier, Fort Lauderdale, FL (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 18/543,963

(22) Filed: Dec. 18, 2023

(65) Prior Publication Data
US 2024/0145164 A1    May 2, 2024

Related U.S. Application Data

(63) Continuation of application No. 17/188,071, filed on Mar. 1, 2021, now Pat. No. 11,848,148, which is a continuation of application No. 16/129,247, filed on Sep. 12, 2018, now Pat. No. 10,935,577.

(60) Provisional application No. 62/557,482, filed on Sep. 12, 2017.

(51) Int. Cl.
| | | |
|---|---|---|
| H01F 27/34 | (2006.01) |
| G01R 19/165 | (2006.01) |
| G05F 1/24 | (2006.01) |
| H04W 4/12 | (2009.01) |

(52) U.S. Cl.
CPC ....... *H01F 27/34* (2013.01); *G01R 19/16547* (2013.01); *G05F 1/24* (2013.01); *H04W 4/12* (2013.01)

(58) Field of Classification Search
CPC ........ H02M 3/335-33592; H02P 13/06; G05F 1/24; H04W 4/12; G01R 19/16547; H02J 3/14
See application file for complete search history.

(56) References Cited

U.S. PATENT DOCUMENTS

| | | | |
|---|---|---|---|
| 4,916,329 A | 4/1990 | Dang et al. | |
| 5,119,981 A * | 6/1992 | Gnuechtel | B65H 23/038 |
| | | | 226/18 |
| 5,602,462 A | 2/1997 | Stich et al. | |

(Continued)

FOREIGN PATENT DOCUMENTS

EP    2672669    12/2013

OTHER PUBLICATIONS

PCT/US2018/050659 International Search Report and written Opinion dated Nov. 7, 2018.

*Primary Examiner* — Thienvu V Tran
*Assistant Examiner* — Shahzeb K Ahmad
(74) *Attorney, Agent, or Firm* — Michael Best & Friedrich LLP

(57) ABSTRACT

An isolation transformer boost system configured to be electrically connected to a shore power supply. The system including an isolation transformer having a primary winding and a secondary winding; and an electronic processor configured to operate in a static mode, wherein in the static mode the electronic processor is configured to activate an electrical characteristic boost when the system is initially powered by the shore power supply.

20 Claims, 5 Drawing Sheets

(56) References Cited

U.S. PATENT DOCUMENTS

| | | | |
|---|---|---|---|
| 5,825,164 A * | 10/1998 | Williams | H02P 13/06 |
| | | | 323/239 |
| 6,751,108 B2 | 6/2004 | Elferich | |
| 9,362,838 B1 * | 6/2016 | Balogh | H02M 7/04 |
| 9,568,937 B1 | 2/2017 | Brooks | |
| 11,169,553 B2 | 11/2021 | Liscinsky et al. | |
| 2011/0162029 A1 | 6/2011 | Huang et al. | |
| 2012/0176819 A1 | 7/2012 | Gao et al. | |
| 2012/0188796 A1 | 7/2012 | Randall | |
| 2012/0310463 A1 * | 12/2012 | Jeong | H02J 7/00036 |
| | | | 701/22 |
| 2013/0050880 A1 | 2/2013 | Rozman et al. | |
| 2014/0153290 A1 | 6/2014 | Li | |
| 2014/0246926 A1 | 9/2014 | Cruz et al. | |
| 2016/0077534 A1 | 3/2016 | Carlen | |
| 2016/0195891 A1 * | 7/2016 | Divan | H02M 5/12 |
| | | | 323/301 |
| 2016/0269019 A1 | 9/2016 | Petersen et al. | |
| 2017/0086281 A1 * | 3/2017 | Avrahamy | H05B 39/086 |

* cited by examiner

Live Vessel Data:

AC Volts:
224
AC Amps:
25
Boost Status:
Normal
Temperature:
73F
Read more

Degr
72F
Raw
22
Raw
22
Read

VOLTAGE BOOSTER ISOLATION TRANSFORMER SYSTEM AND METHOD OF OPERATING THE SAME

RELATED APPLICATIONS

This application claims priority to U.S. patent application Ser. No. 17/188,071, filed Mar. 1, 2021, which claims priority to U.S. patent application Ser. No. 16/129,247, filed Sep. 12, 2018, which claims priority to U.S. Provisional Patent Application No. 62/557,482, filed on Sep. 12, 2017, the entire contents of all of which are incorporated herein by reference.

FIELD

Embodiments relate to isolation transformer systems with booster systems.

SUMMARY

Watercrafts may demand shore supply or shoreside electrical power at berth while its main and auxiliary engines are shut down to save fuel while docked. Shore supply, whether from the grid of an electrical utility company or an external remote generator, is run from the shore to the watercraft's allotted place at the wharf or dock. The shore supply is fed to a transformer system within the watercraft, which supplies power to the watercraft's electrical system.

Occasionally, the length at which the shore supply is run from its main source to a docked watercraft may be significant enough to cause an undesirable drop in power over the length of the cable. Similarly, the number of watercrafts also pulling power from the shore supply may also cause an undesirable power drop.

Thus, one embodiment provides an isolation transformer boost system. The system includes an isolation transformer, a sensor, and an electronic processor coupled to the sensor. The electronic processor configured to receive an electrical characteristic measurement from the sensor, compare the electrical characteristic measurement to a predetermined threshold, and activate an electrical characteristic boost when the electrical characteristic measurement is below the predetermined threshold.

Another embodiment provides a method of boosting an electrical characteristic of an isolation transformer of an isolation transformer system. The method includes receiving, from a sensor, an electrical characteristic measurement, comparing the electrical characteristic measurement to a predetermined threshold, and activating an electrical characteristic boost when the electrical characteristic measurement is below the predetermined threshold.

Other aspects of the various embodiments will become apparent by consideration of the detailed description and accompanying drawings.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed subject matter, and explain various principles and advantages of those embodiments.

Figure 1:
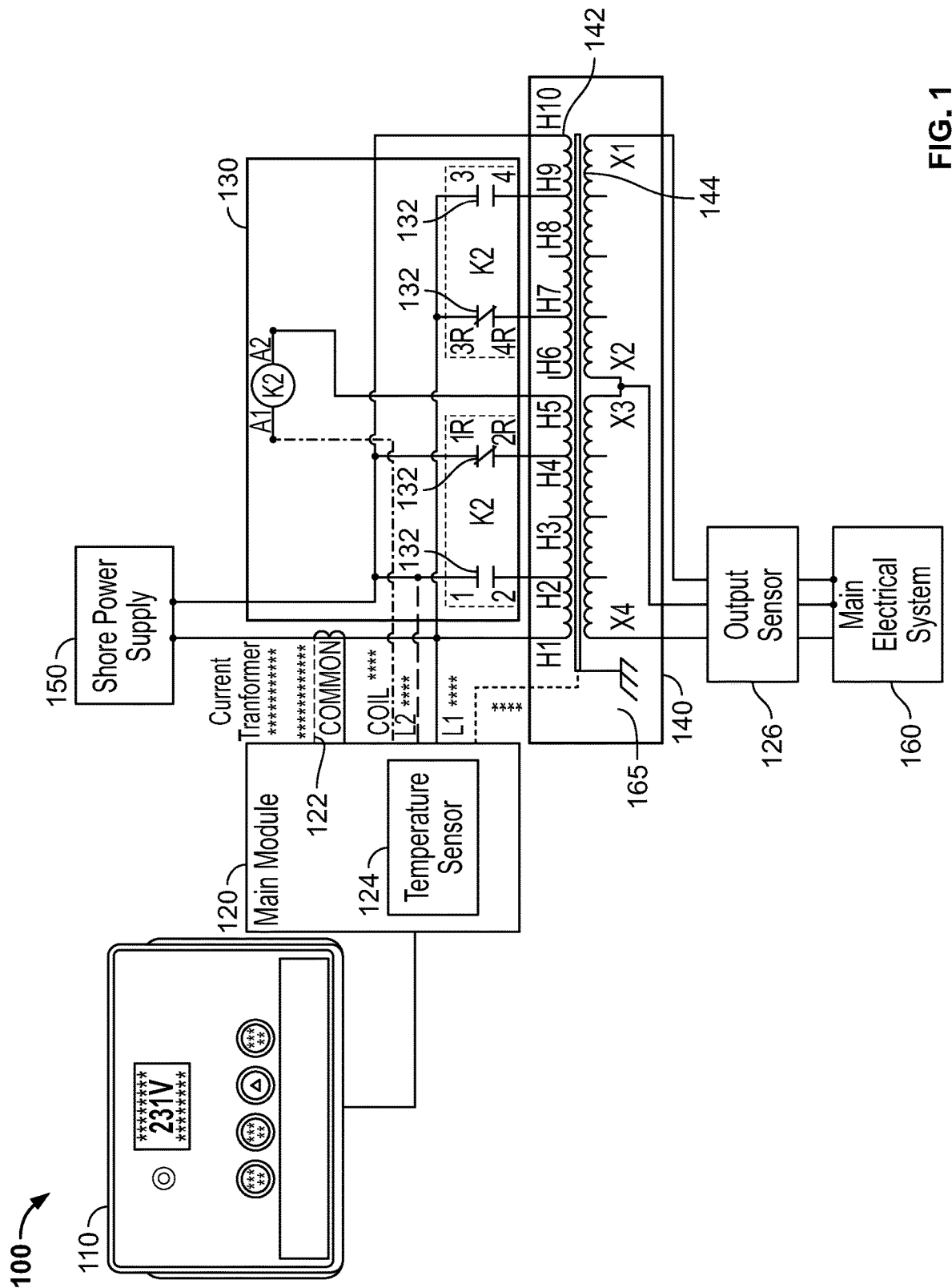
FIG. 1 illustrates a schematic diagram of an isolation transformer booster system of a transformer according to some embodiments.

The system and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

For ease of description, each of the exemplary systems or devices presented herein is illustrated with a single exemplar of each of its component parts. Some examples may not describe or illustrate all components of the systems. Other exemplary embodiments may include more or fewer of each of the illustrated components, may combine some components, or may include additional or alternative components. For example, the systems and the methods are described in terms of only a single isolation transformer. It should be understood that, in some embodiments, the systems and methods may include additional isolation transformers.

FIG. 1 illustrates an isolation transformer system 100. The system 100 includes a remote control module 110, a main module 120, a contactor 130, and an isolation transformer 140. The isolation transformer 140 is configured to receive power, for example, from a shore power supply 150, and provides power to a main electrical system 160. The main electrical system 160 may be, for example, an electrical system of a watercraft. In some embodiments, the shore power supply 150 is approximately 210 VAC to approximately 250 VAC (for example, approximately 240 VAC). In other embodiments, the shore power supply is approximately 110 VAC to approximately 130 VAC (for example, approximately 120 VAC).

Figure 2:
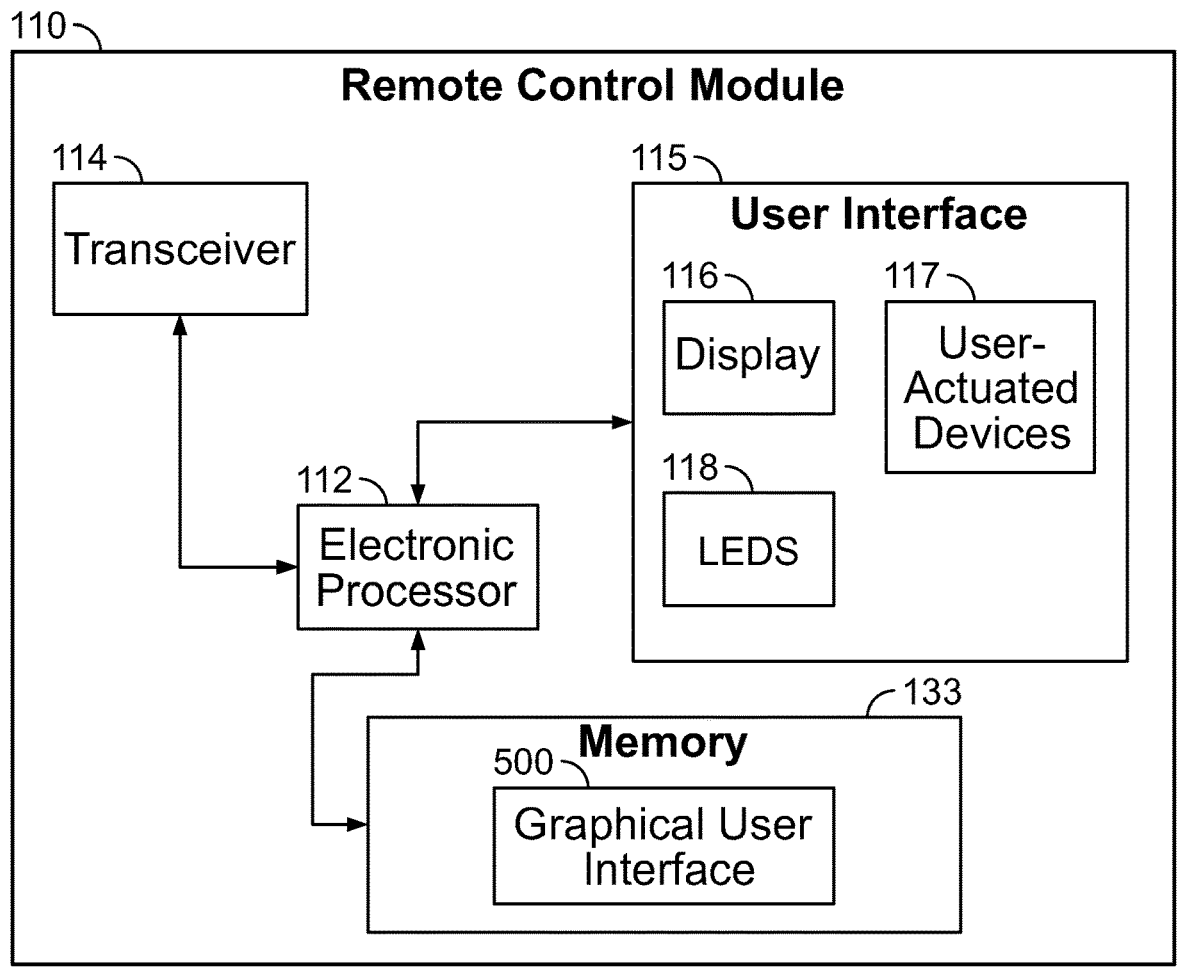
FIG. 2 illustrates a block diagram of a remote control module of the system of FIG. 1 according to some embodiments.

As illustrated in FIG. 2, the remote control module 110 may include an electronic processor 112, a memory 113, a transceiver 114, and a user interface 115. The memory 113 includes, for example, a program storage area and a data storage area. The program storage area and the data storage area can include combinations of different types of memory, such as read-only memory (ROM), random access memory (RAM). Various non-transitory computer readable media, for example, magnetic, optical, physical, or electronic memory may be used. The electronic processor 112 is communicatively coupled to the memory 113 and executes software instructions that are stored in the memory 113, or stored on another non-transitory computer readable medium such as another memory or a disc. The software may include one or more applications, program data, filters, rules, one or more program modules, and other executable instructions.

The transceiver 114 is configured to enable wireless communication between the remote control module 110 and the main module 120, via, for example, a wireless communication link. In other embodiments, rather than a transceiver 114, the remote control module 110 may include separate transmitting and receiving components, for example, a transmitter and a receiver. In operation, the electronic processor 112 is configured to control the transceiver 114 to transmit and receive data to and from the remote control module 110. The electronic processor 112 encodes and decodes digital data sent and received by the transceiver 114. The transceiver 114 transmits and receives radio signals to and from various wireless communication networks. The electronic processor 112 and the transceiver 114 may include various digital and analog components, which for brevity are not described herein and which may be implemented in hardware, software, or a combination of both. Some embodiments include separate transmitting and receiving components, for example, a transmitter and a receiver, instead of a combined transceiver 114.

The electronic processor 112 is configured to enable the user interface 115, implemented by the electronic processor 112, from instructions and data stored in the memory 113. The user interface 115 may include various digital and analog components, which for brevity are not described herein and which may be implemented in hardware, software, or a combination of both. For example, as illustrated in FIG. 2, the user interface 115 may include a display 116, one or more user-actuated devices 117, and one or more light emitting diodes (LEDS) 118. The user interface 115 is configured to receive commands from (for example, via the user-actuated devices 117 and/or the display 116) and display information to (for example, via the one or more LEDs 118 and/or the display 116) a user of the system 100. For example, the electronic processor 112 is configured to display information related to the system 100 on the display 116. In some embodiments, the display 116 is a suitable touch-sensitive interface display such as, for example, a liquid crystal display (LCD) touch screen, or an organic light-emitting diode (OLED) touch screen. In such an embodiment, the display 116 displays output and receives user input using detected physical contact (for example, via detected capacitance or resistance). The electronic processor 112 may be configured to implement a graphical user interface on the display 116, which is described in detail below with respect to FIGS. 5 and 6. In some embodiments, the display 116 may be configured to visually indicate a state of operation of the system 100. For example, when an electrical characteristic boost is active (described in more detail below), the display 116 may illuminate a particular color and when the system 100 is receiving a low input from the shore power supply 150, the display 116 may illuminate a different color.

Figure 3:
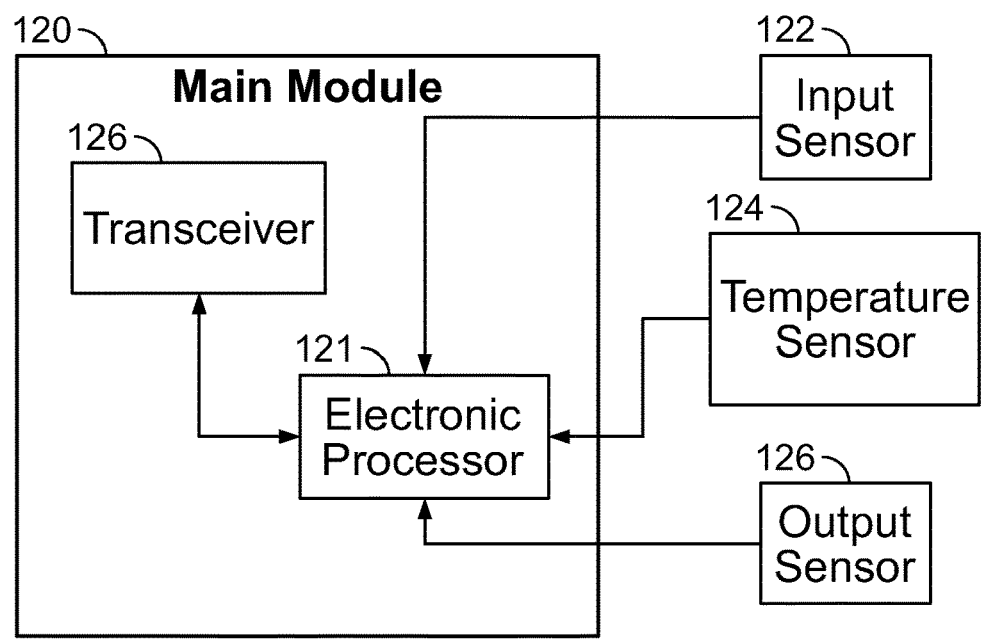
FIG. 3 illustrates a block diagram of a main module of the system of FIG. 1 according to some embodiments.

FIG. 3 is a schematic diagram illustrating the main module 120. The main module 120 includes an electronic processor 121 coupled to an electrical characteristic input sensor 122 (also illustrated in FIG. 1). The input sensor 122 is configured to sense one or more types of electrical characteristics between the shore power supply 150 and the isolation transformer 140. For example, the sensor 122 may be configured to sense the voltage, current, and/or power. In some embodiments, the main module 120 further includes a temperature sensor 124 (also illustrated in FIG. 1). The temperature sensor 124 is coupled to the electronic processor 121 and is configured to measure one or more temperatures within the system 100. In some embodiments the system 100 also includes an electrical characteristic output sensor 126 (also illustrated in FIG. 1). The output sensor 126 is configured to sense one or more types of electrical characteristics between the isolation transformer 140 and the main electrical system 160. For example, the output sensor 126 may be configured to sense the voltage, current, and/or power. In some embodiments, the system 100 includes additional sensors coupled to the electronic processor 121 and configured to measure electrical characteristics within the system 100. The main module 120 may further include various digital and analog components, which for brevity are not described herein and which may be implemented in hardware, software, or a combination of both (for example, a memory).

In some embodiments, the main module 120 includes a transceiver 127 and is configured to communicate with the remote control module 110. For example, the main module 120 is configured to transmit measurements from the sensors (for example, the sensors 122, 124, and 126) to the remote control module 110 (for example, to the transceiver 114). In some embodiments, the remote control module 110 may be mounted a distance away from the main module 120. Alternatively or in addition to the transceiver 127, the remote control module 110 may be communicatively coupled to the main module 120 via a wired connection (as illustrated in FIG. 1).

Returning to FIG. 1, the main module 120 is coupled to the contactor 130. The contactor 130 includes one or more switches 132 each coupled to one or more voltage taps of a primary winding 142 of the isolation transformer 140. As explained in more detail below, the contactor 130 is configured to receive a command from the main module 120 to activate and/or deactivate an electrical characteristic boost by actuating one or more contactor switches 132. In some embodiments, the contactor 130 is an 80A or a 100A contactor.

The isolation transformer 140 includes a primary winding 142 and a secondary winding 144. The isolation transformer 140 is configured to receive power from the shore power supply 150 through the contactor 130 to the primary winding 142. The power through the primary winding 142 induces power within the secondary winding 144. The power from the secondary winding 144 is then provided to the main electrical system 160.

In some embodiments, the isolation transformer 140 includes an electrostatic shield. In such an embodiment, the electrostatic shield may prevent, or reduce, any electrical noise produced by the isolation transformer 140. In some embodiments, the electrostatic shield is located between the primary winding 142 and the secondary winding 144. In some embodiments, the electrostatic shield is electrically grounded. In some embodiments, the electrostatic shield is grounded separately from an isolation transformer ground 165. In such an embodiment, the electrostatic shield may be grounded via a six-gauge insulated wire.

Figure 4:
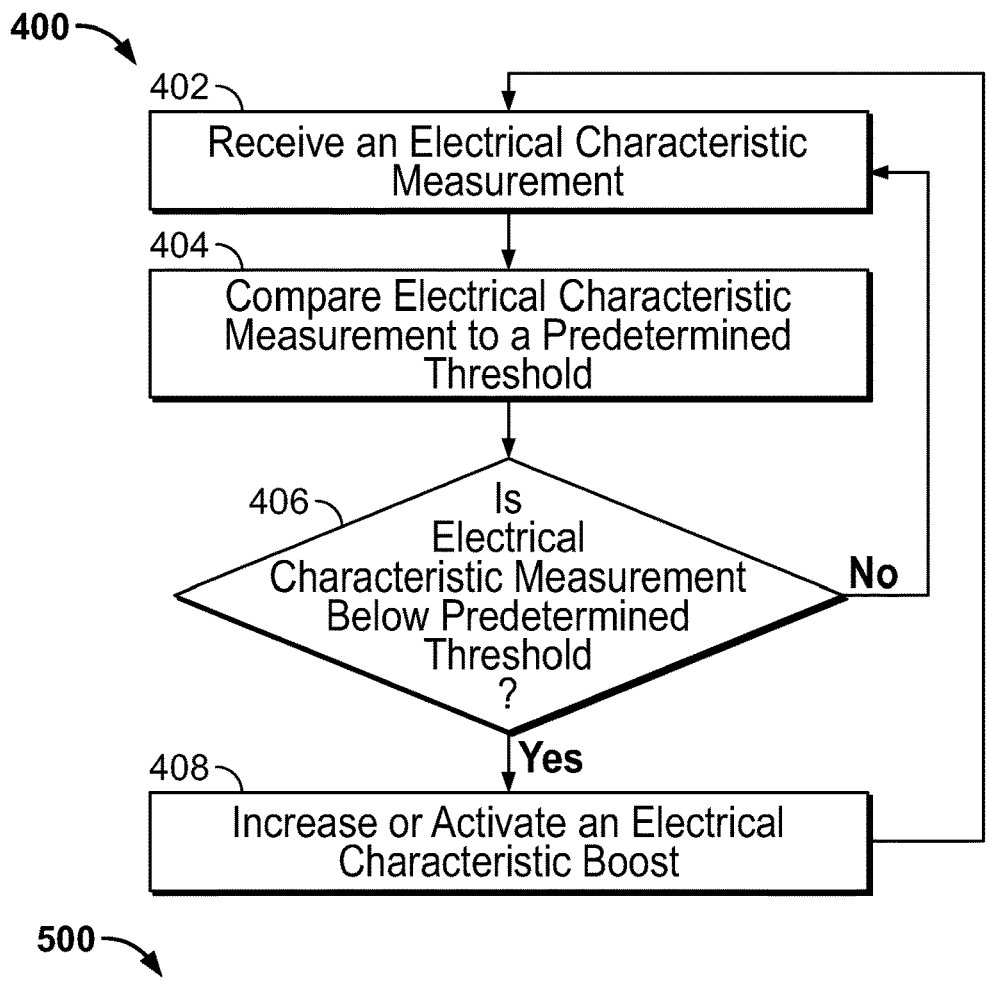
FIG. 4 illustrates a flowchart illustrating a method of operating the system of FIG. 1 according to some embodiments.

FIG. 4 illustrates a method 400 of operating the system 100. It should be understood that although the method 400 is described herein in terms of the main module 120, in some embodiments one or more steps of the method 400 may also be performed by the remote control module 110. At block 402, the main module 120 receives, from the input electrical characteristic sensor 122, an electrical characteristic measurement. At block 404, the main module 120 compares the electrical characteristic measurement to a predetermined threshold. The predetermined threshold may be at least one selected from the group consisting of approximately 190V to approximately 220V (for example, 190V, 195V, 200V, 205V, 210V, 215V, and 220V). In some embodiments, the electrical characteristic measurement is compared to more than one predetermined threshold. At block 406, the main module 120 determines if the electrical characteristic measurement is below the predetermined threshold. When the electrical characteristic measurement exceeds the predetermined threshold, the method 400 may return to block 402. When the electrical characteristic is below the predetermined threshold, at block 408 the main module 120 activates an electrical characteristic boost. The electrical characteristic boost is activated by actuating the contactor 130 (specifically, one or more of its switches 132 connected to one or more voltage taps of the primary winding 142). The electrical characteristic boost may be, for example, a voltage boost. In some embodiments, the electrical characteristic boost is a percent amount of the electrical characteristic measurement (for example, an approximately 10% boost). In other embodiments, the electrical characteristic boost is a fixed amount (for example, approximately 10 VAC). The method 400 may then return to block 402.

In some embodiments, the main module 120 is configured to activate the electrical characteristic boost when the electrical characteristic measurement is below the predetermined threshold for a predetermined time period. The predetermined time period may be, for example, approximately thirty seconds. This may be to avoid activating the boost in response to a momentary power fluctuation.

In some embodiments, the method 400 further includes comparing the electrical characteristic measurement to a predetermined upper limit threshold, and decreasing or deactivating the electrical characteristic boost when the electrical characteristic measurement exceeds the predetermined upper limit threshold. In some embodiments, the main module 120 is configured to decrease or deactivate the electrical characteristic boost when the electrical characteristic measurement exceeds the predetermined upper limit threshold for a predetermined time period. For example, the predetermined time period may be five seconds. This may be to avoid activating the boost in response to a momentary power fluctuation.

In some embodiments, the system 100 is configured to run in one of a plurality of modes of operation. The modes of operation may include an automatic mode, a manual mode, and a programming mode.

In the automatic mode, the main module 120 is configured to automatically affect (activate, deactivate, increase, or decrease) the electrical characteristic boost based on the electrical characteristic measurement. In some embodiments, the automatic mode further includes a static mode and a dynamic mode. In such an embodiment, when the system 100 is running in the static mode, the main module 120 is configured to activate the electrical characteristic boost when the system 100 is initially powered on by the shore power supply 150. Likewise, when the system 100 is running in the dynamic mode, the main module 120 is configured to automatically affect the electrical characteristic boost while the system 100 is operating.

When the system 100 is in the manual mode, the main module 120 is configured to affect the electrical characteristic boost based on a user input, rather than automatically. The user input may be received, for example, via the user interface 115 of the remote control module 110. In response to the user input, the main module 120 may, for example, activate, deactivate, increase, or decrease the electrical characteristic boost.

When the system 100 is in the programming mode, the main module 120 is configured to receive, via the user interface 115 of the remote control module 110, one or more commands to adjust a setting of the operation of the system 100. For example, the main module 120 may receive a command to adjust the predetermined threshold or the predetermined upper threshold. While in the programming mode, the remote control module 110 may be configured to receive a user command to activate a mode of operation (for example, automatic, static, dynamic, or manual).

In some embodiments, while the system 100 is in the programming mode, the remote control module 110 may be configured to connect the system 100 to a wireless network and/or create a wireless access point. In such an embodiment, the system 100 may be configured to be coupled, via the network or access point to a portable communication device (for example, a smartphone, laptop, tablet, and the like). The system 100 may then receive commands from the portable communication device in lieu of or in addition to the remote control module 110.

In some embodiments, the system 100 while in the programming mode is further configured to calibrate the input sensor 122, the temperature sensor 124, the output sensor 126, and/or any other sensors within the system 100. In such an embodiment, the system 100 may be further configured to be manually calibrated via the remote control module 110 (for example, via the user interface 115).

In some embodiments, the main module 120 is further configured to compare the electrical characteristic measurement to a maximum limit threshold. In such an embodiment, when the electrical characteristic measurement exceeds the maximum limit threshold, the main module 120 may be configured to not activate the electrical characteristic boost (regardless of whether the system 100 is in the automatic mode or the manual mode). This may be to prevent an overpower condition from occurring. In some embodiments, the maximum limit threshold is approximately 225 V.

Figure 5:
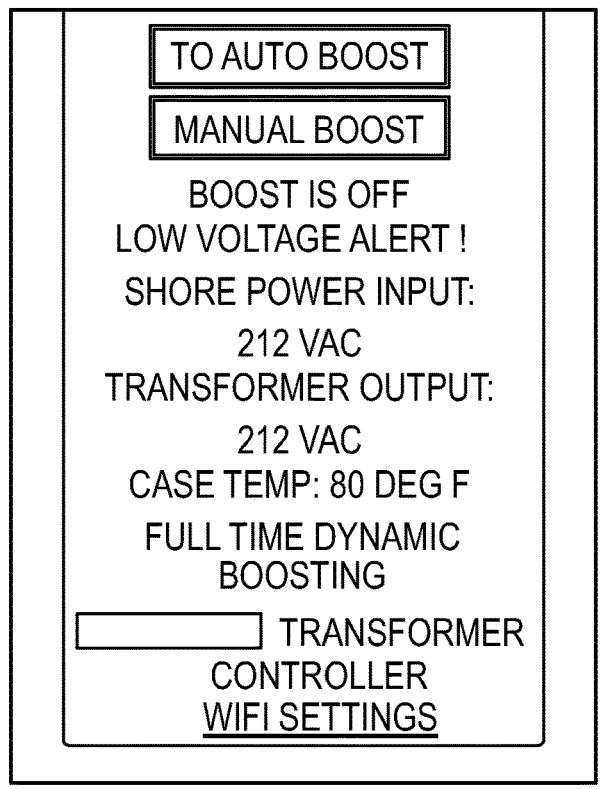
FIG. 5 illustrates an example of a graphical user interface screen of the remote control module of FIG. 2 within a browser of a portable communications device according to some embodiments.

As mentioned above in regard to FIG. 2, in some embodiments, the remote control module 110 includes a graphical user interface. As also mentioned above in regard to FIG. 2, in some embodiments, the remote control module 110 is configured to create a wireless access point and/or connect to a wireless network. The graphical user interface may include a graphical interface for a user to use when attempting to connect to the wireless access point of the system 100. FIG. 5 illustrates an example of a graphical user interface screen 500 of the remote control module 110 within a browser of a portable communications device attempting to connect to the wireless access point of the system 100. The interface screen 500 may include the current mode of operation, present measurements, thresholds, and alerts regarding the system 100.

Figure 6:
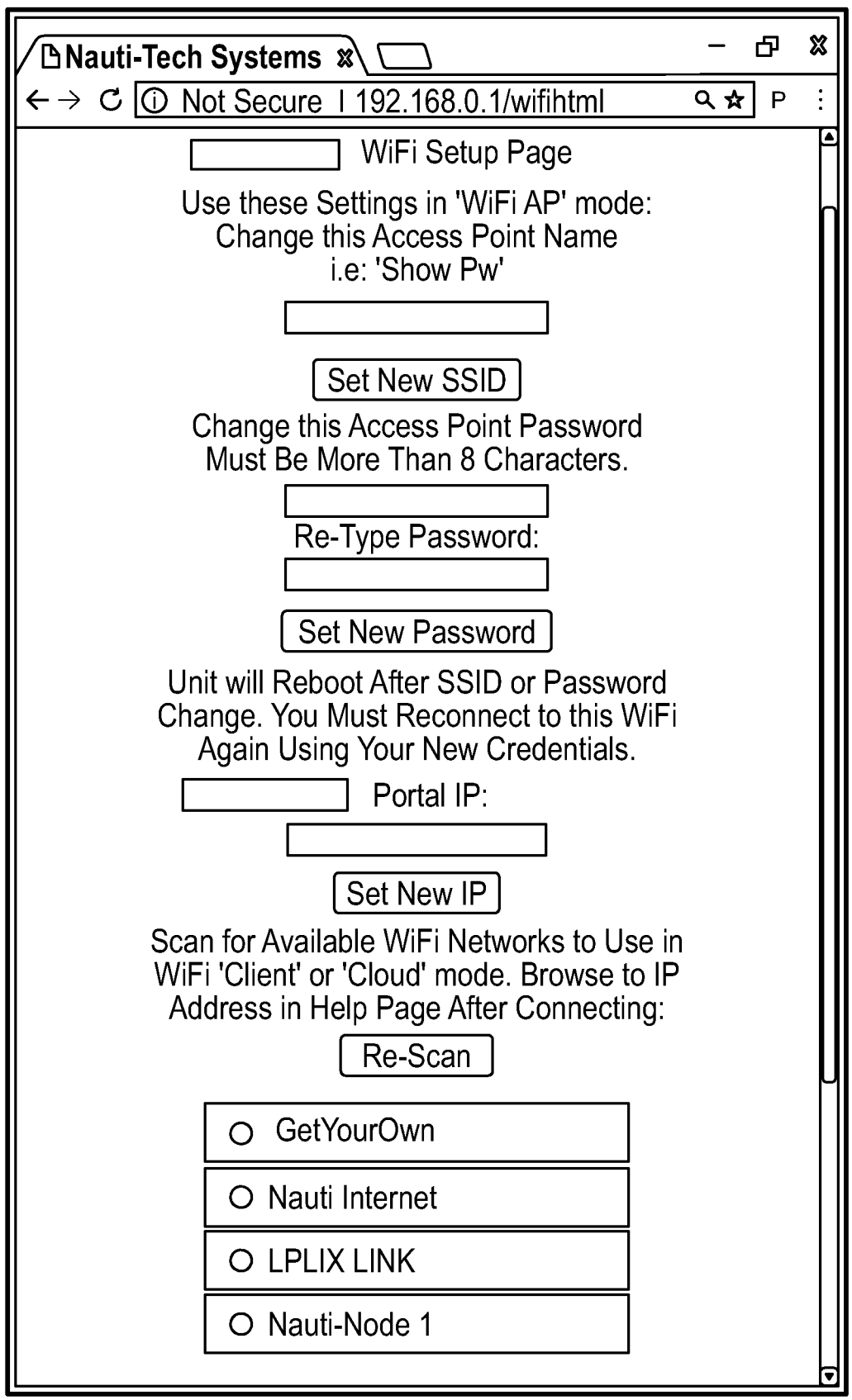
FIG. 6 illustrates a screen of a set-up page for configuring settings of the wireless access point and for joining wireless network of the remote control module of FIG. 2 according to some embodiments.

FIG. 6 illustrates a screen of a set-up page 600 for configuring settings of the wireless access point and for joining wireless network of the remote control module 110.

The settings may include, for example, a network service set identifier (SSID), creating/modifying a password to access the network, and creating/modifying an internet protocol (IP) address. The page 600 may also include a scan button to find and present local wireless networks the system 100 may connect to. The set-up page 600 may be accessible through a web browser on a portable communications device.

Figures 7, 8:
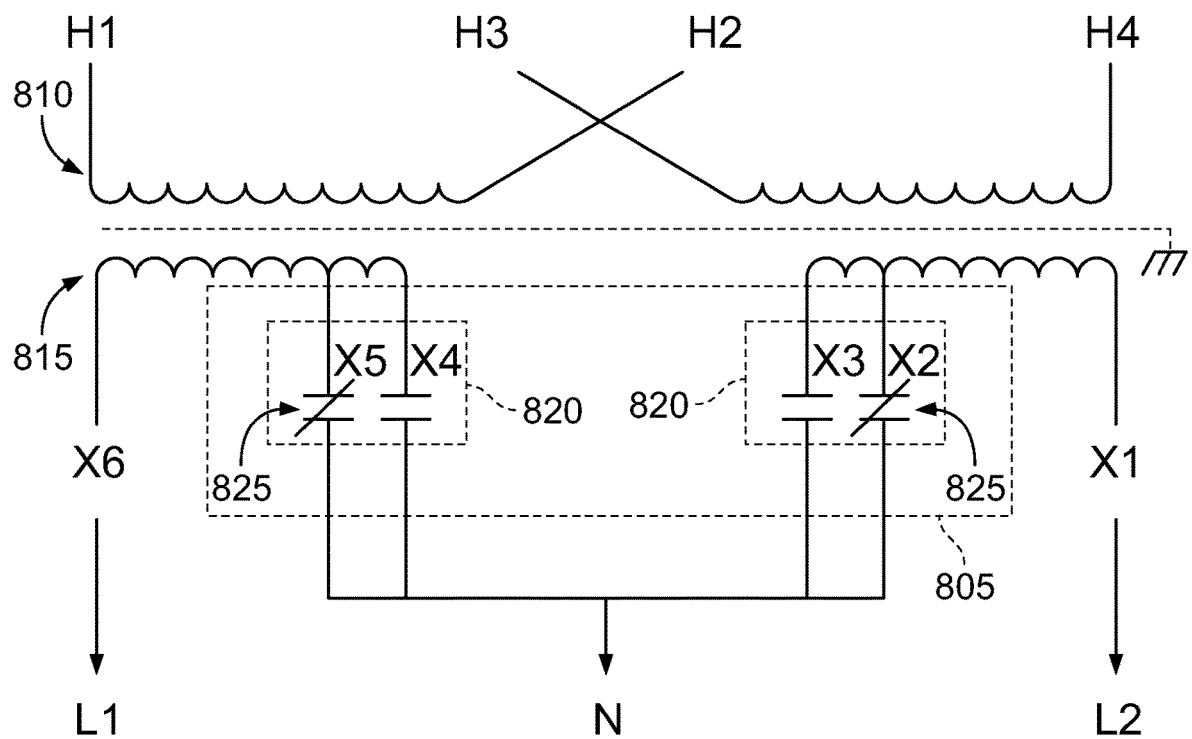
FIG. 7 illustrates a status update transmitted by the remote control module of FIG. 2 according to some embodiments.
FIG. 8 illustrates an isolation transformer of the system of FIG. 1 according another embodiment.

In some embodiments, the remote control module 110 is further configured to transmit a status update regarding the system 100 to a remote server through the wireless network. In such an embodiment, the remote control module 110 is configured to automatically transmit a status update periodically. FIG. 7 illustrates an example status update 700. The status update 700 may include electrical characteristic measurements and temperature measurements from the sensors within the system 100 (for example, sensors 122, 124, and 126). The status update 700 may also include an electrical characteristic boost status. In some embodiments, pages 500, 600, and 700 may be accessed via a remote device (for example, a smartphone, an external computer, a tablet, etc.). Additionally, in some embodiments, the system 100 may be monitored and/or controlled via the remote device.

FIG. 8 illustrates an isolation transformer 800 and contactor 805 according to some embodiments. Isolation transformer 800 and contactor 805 may be used in conjunction with system 100 (for example, in lieu of isolation transformer 140 and contactor 130).

In the illustrated embodiment, isolation transformer 800 includes a primary winding 810 and a second winding 815. The isolation transformer 800 is configured to receive power from the shore power supply 150. The power through the primary winding 810 induces power within the secondary winding 815. The power (for example, nominal voltage via L1, L2, and N) from the secondary winding 815 is then provided to the main electrical system 160 through contactor 805.

In the illustrated embodiment, contactor 805 includes one or more sets of switches 820, each having one or more switches 825. The switches 825 may be coupled to one or more voltage taps (for example, voltage taps X2, X3, X4, and X5). The contactor 805 is configured to receive a command from the main module 120 to activate and/or deactivate the electrical boost by actuating the one or more switches 825. In some embodiments, isolation transformer 800 and contactor 805 is operated in a similar manner as described with respect to method 400. Furthermore, in some embodiments, the isolation transformer 800 and contactor 805 provide similar electrical characteristic boosts as described above with respect to isolation transformer 140 and contactor 130.

It should be noted that a plurality of hardware and software based devices, as well as a plurality of different structural components may be utilized to implement the invention. In some embodiments, the invention provides a software application that is executable on a personal computing device, such as a smart phone, tablet computer, smart watch, and the like. In some embodiments, the software application may be stored and executed by a remote computing device, such as a server. In particular, the software application may be executed by a server, and a user can access and interact with the software application using a recognition device. Also, in some embodiments, functionality provided by the software application as described above may be distributed between a software application executed by a user's portable communication device and a software application executed by another electronic process or device (for example, a server) external to the recognition device. For example, a user can execute a software application (for example, a mobile application) installed on his or her smart device, which is configured to communicate with another software application installed on a server.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more electronic processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment may be implemented as a computer-readable storage medium having computer readable code stored thereon for programming a computer (for example, comprising an electronic processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An isolation transformer boost system configured to be electrically connected to a shore power supply, the system comprising: an isolation transformer having a primary winding and a secondary winding; and an electronic processor configured to operate in a static mode, wherein in the static mode the electronic processor is configured to activate an electrical characteristic boost when the system is initially powered by the shore power supply; wherein a display is illuminated with a first color when the electrical characteristic boost is activated and the display is illuminated with a second color when the isolation transformer is receiving a low input from the shore power supply.

2. The system of claim 1, wherein while the system is operating, the electronic processor is further configured to activate the electrical characteristic boost when an electrical characteristic measurement is below a predetermined threshold for a predetermined time period.

3. The system of claim 1, wherein the electronic processor is further configured to
compare an electrical characteristic measurement to a predetermined upper limit threshold, and
deactivate the electrical characteristic boost.

4. The system of claim 3, wherein while the system is operating, the electronic processor is configured to deactivate the electrical characteristic boost when the electrical characteristic measurement is above the predetermined upper limit threshold for a predetermined time period.

5. The system of claim 1, wherein the system is configured to run in one of a plurality of modes of operation, wherein the one of the plurality of modes of operation is selected from a group consisting of
an automatic mode;
a manual mode; and
a programming mode.

6. The system of claim 5, wherein the automatic mode further includes a dynamic mode, wherein while the system is running in the dynamic mode, the electronic processor is configured to automatically affect the electrical characteristic boost while the system is operating; and
wherein while the system is running in the programming mode, the system is configured to receive one or more commands to adjust a setting of the operation of the system.

7. The system of claim 1, wherein the electronic processor is further configured to provide a wireless access point.

8. The system of claim 1, wherein the electronic processor is further configured to connect to a wireless network.

9. The system of claim 8, wherein the electronic processor is further configured to automatically transmit a status update regarding the system to a remote server.

10. The system of claim 1, the system further comprising a contactor and wherein activating the electrical characteristic boost includes actuating the contactor.

11. The system of claim 10, wherein the contactor is coupled to a voltage tap of the primary winding of the isolation transformer.

12. A method of boosting an electrical characteristic of an isolation transformer of an isolation transformer system, the method comprising: providing the isolation transformer having a primary winding and a secondary winding; and operating in a static mode, wherein when in the static mode the system is configured to activate an electrical characteristic boost when the system is initially powered by a shore power supply; and illuminating a display with a first color when the electrical characteristic boost is activated and illuminating the display with a second color when the isolation transformer is receiving a low input from the shore power supply.

13. The method of claim 12, the method further comprising, while the isolation transformer system is operating, activating the electrical characteristic boost when an electrical characteristic measurement is below a predetermined threshold for a predetermined time period.

14. The method of claim 13, the method further comprising:
comparing the electrical characteristic measurement to a predetermined upper limit threshold, and
deactivating the electrical characteristic boost.

15. The method of claim 14, the method further comprising, while the isolation transformer system is operating, deactivating the electrical characteristic boost when the electrical characteristic measurement is above the predetermined upper limit threshold for a predetermined time period.

16. The method of claim 12, wherein activating the electrical characteristic boost includes actuating a contactor.

17. The method of claim 16, wherein the contactor is connected to a voltage tap of the primary winding of the isolation transformer.

18. The method of claim 12, further comprising automatically transmitting a status update regarding the system to a remote server.

19. The method of claim 12, wherein the system includes a contactor and wherein activating the electrical characteristic boost includes actuating the contactor.

20. The method of claim 19, wherein the contactor is coupled to a voltage tap of the primary winding of the isolation transformer.

\* \* \* \* \*